(12) United States Patent
Chandra et al.

(10) Patent No.: US 11,152,206 B2
(45) Date of Patent: Oct. 19, 2021

(54) COMPOSITIONS AND METHODS USING SAME FOR CARBON DOPED SILICON CONTAINING FILMS

(71) Applicant: Versum Materials US, LLC, Tempe, AZ (US)

(72) Inventors: Haripin Chandra, San Marcos, CA (US); Xinjian Lei, Vista, CA (US); Anupama Mallikarjunan, Taipei III (TW); Moo-Sung Kim, Gyunggi-do (KR)

(73) Assignee: Versum Materials US, LLC, Tempe, AZ (US)

( * ) Notice: Subject to any disclaimer, the term of this patent is extended or adjusted under 35 U.S.C. 154(b) by 80 days.

(21) Appl. No.: 16/748,914

(22) Filed: Jan. 22, 2020

(65) Prior Publication Data

US 2020/0203155 A1 Jun. 25, 2020

Related U.S. Application Data

(62) Division of application No. 15/654,426, filed on Jul. 19, 2017, now abandoned.

(Continued)

(51) Int. Cl.
*H01L 21/02* (2006.01)
*C23C 16/56* (2006.01)
(Continued)

(52) U.S. Cl.
CPC ...... *H01L 21/02208* (2013.01); *C23C 16/308* (2013.01); *C23C 16/345* (2013.01); *C23C 16/402* (2013.01); *C23C 16/45525* (2013.01); *C23C 16/45553* (2013.01); *C23C 16/56* (2013.01); *H01L 21/0217* (2013.01); *H01L 21/0228* (2013.01); *H01L 21/0234* (2013.01);
(Continued)

(58) Field of Classification Search
None
See application file for complete search history.

(56) References Cited

U.S. PATENT DOCUMENTS 8,575,033 B2 11/2013 Weldman et al.
9,343,290 B2 5/2016 Hirose et al.
(Continued)

FOREIGN PATENT DOCUMENTS

CN 101407466 A 4/2009
CN 103539675 A 1/2014
(Continued)

OTHER PUBLICATIONS

Chopade, L., et al. "Dehydration of Ethanol-Water Mixture Using 3a Zeolite Adsorbent", International Journal of Emerging Technology and Advanced Engineering, vol. 5, Issue 11, Nov. 2015, pp. 152-155.
(Continued)

*Primary Examiner* — Joseph D Anthony
(74) *Attorney, Agent, or Firm* — David K. Benson

(57) ABSTRACT

A composition and method for using the composition in the fabrication of an electronic device are disclosed. Compounds, compositions and methods for depositing a low dielectric constant (<4.0) and high oxygen ash resistance silicon-containing film such as, without limitation, a carbon doped silicon oxide, are disclosed.

2 Claims, 1 Drawing Sheet

Related U.S. Application Data

(60) Provisional application No. 62/367,260, filed on Jul. 27, 2016.

(51) Int. Cl.

| | | |
|---|---|---|
| *C23C 16/455* | (2006.01) | |
| *C23C 16/34* | (2006.01) | |
| *C23C 16/40* | (2006.01) | |
| *C23C 16/30* | (2006.01) | |

(52) U.S. Cl.
CPC .. *H01L 21/02118* (2013.01); *H01L 21/02126* (2013.01); *H01L 21/02164* (2013.01); *H01L 21/02211* (2013.01); *H01L 21/02326* (2013.01); *H01L 21/02337* (2013.01)

(56) References Cited

U.S. PATENT DOCUMENTS

| | | | |
|---|---|---|---|
| 9,349,586 B2 | 5/2016 | Shimamoto et al. | |
| 9,633,838 B2 * | 4/2017 | Girard | H01L 21/02208 |
| 9,640,386 B2 * | 5/2017 | Xiao | H01L 21/02211 |
| 10,145,008 B2 * | 12/2018 | Chandra | H01L 21/0228 |
| 10,249,489 B2 * | 4/2019 | Vrtis | H01L 21/02203 |
| 10,985,010 B2 * | 4/2021 | Chandra | H01L 21/3105 |
| 2012/0270998 A1 | 10/2012 | Koh et al. | |
| 2013/0022496 A1 | 1/2013 | Herdt et al. | |
| 2013/0052836 A1 | 2/2013 | Hirose et al. | |
| 2013/0071580 A1 | 3/2013 | Weidman et al. | |
| 2014/0287596 A1 | 9/2014 | Hirose et al. | |
| 2015/0044884 A1 | 2/2015 | Shimamoto et al. | |
| 2016/0111272 A1 * | 4/2016 | Girard | C23C 16/24 438/770 |
| 2018/0023192 A1 * | 1/2018 | Chandra | H01L 21/02354 438/760 |
| 2018/0033614 A1 * | 2/2018 | Chandra | C23C 16/345 |
| 2018/0122632 A1 * | 5/2018 | Vrtis | C23C 16/505 |
| 2020/0071819 A1 * | 3/2020 | Lei | C23C 16/45553 |
| 2020/0075312 A1 * | 3/2020 | Chandra | C23C 16/345 |
| 2020/0203155 A1 * | 6/2020 | Chandra | H01L 21/02164 |
| 2020/0270749 A1 * | 8/2020 | Li | C23C 16/36 |

FOREIGN PATENT DOCUMENTS

| | | |
|---|---|---|
| TW | 200745268 A | 12/2007 |
| WO | 2014134476 A1 | 9/2014 |
| WO | 2018022719 A1 | 2/2018 |

OTHER PUBLICATIONS

Dow Chemical Company "Ethyleneamines: Storage & Handling", Midland, Michigan, published Nov. 2001.

Sowerby, B., et al. "An Experimental Comparison of Type A Molecular Sieves for Drying the Ethanol-Water Azeotrope", Gas Separation & Purification, vol. 2, Jun. 1988, p. 77-83.

PCT International Search Report, PCT/US2017/043064, dated Oct. 30, 2017.

Han, Z., et al., "Highly Stable Ultrathin Carbosiloxane Films by Molecular Layer Deposition", Journal of Physical Chemistry C, 2013, 117, 19967.

Liu, et al., "Enhancing the Oxygen Plasma Resistance of Low-k Methylsilsesquioxane by H2 Plasma Treatment", Jpn. J. Appl. Phys., vol. 38 (1999) pp. 3482-3486.

Kim, Yoon-Hae, et al, "Passivation Effect on Low-k SiOC Dielectrics by H2 Plasma Treatment", Journal of the Korean Physical Society, vol. 40, No. 1, Jan. 2002, pp. 94-98.

Posseme, N., et al., "Impact of Downstream Ash Plasmas on Ultra Low-k Materials", Solid State Phenomena, vols. 103-104 (2005) pp. 337-340.

* cited by examiner

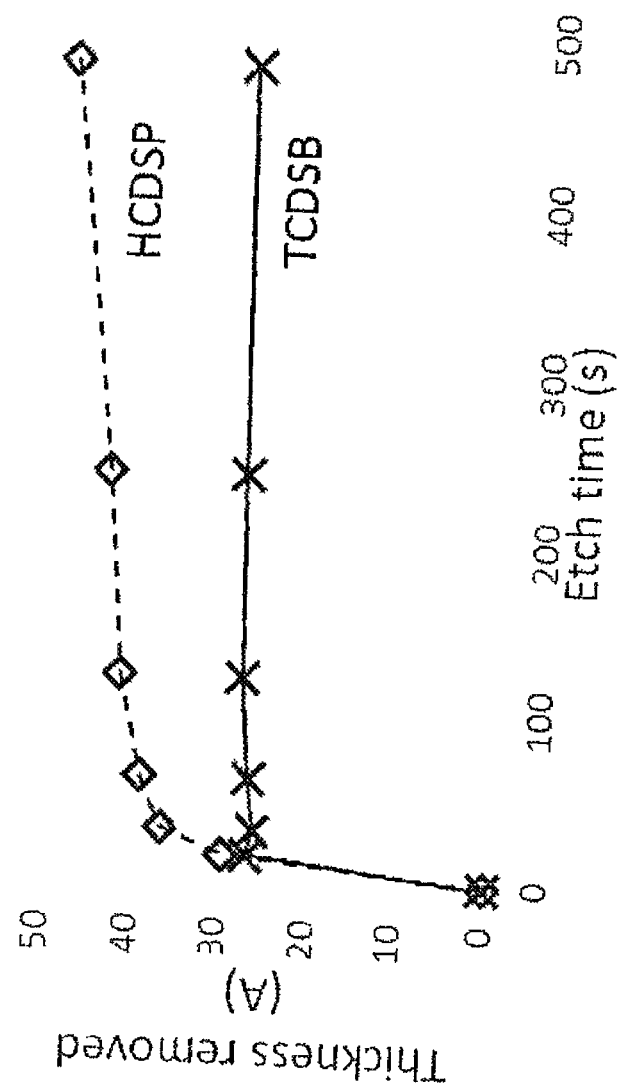

COMPOSITIONS AND METHODS USING SAME FOR CARBON DOPED SILICON CONTAINING FILMS

CROSS-REFERENCE TO RELATED APPLICATIONS

This application claims the benefit of application Ser. No. 15/654,426, filed on Jul. 19, 2017, which claims benefit of application Ser. No. 62/367,260, filed on Jul. 27, 2016. The disclosure of application Ser. Nos. 15/654,426 and 62/367,260 are hereby incorporated by reference.

The subject matter of this disclosure is related to Patent Cooperation Treaty Application No. PCT/US2016/016514, filed on Feb. 4, 2016. The disclosure of Application No. PCT/US2016/016514, is hereby incorporated by reference.

BACKGROUND OF THE INVENTION

Described herein is a composition and method for the fabrication of an electronic device. More specifically, described herein are compounds, and compositions and methods comprising same, for the deposition of a low dielectric constant (<4.0) and high oxygen ash resistance silicon-containing film such as, without limitation, a carbon doped silicon oxide, a carbon doped silicon nitride, a carbon doped silicon oxynitride.

There is a need in the art to provide a composition and method using same for depositing high carbon content (e.g., a carbon content of about 10 atomic % or greater as measured by X-ray photoelectron spectroscopy (XPS)) doped silicon-containing films for certain applications within the electronics industry.

U.S. Pat. No. 8,575,033 describes methods for deposition of silicon carbide films on a substrate surface. The methods include the use of vapor phase carbosilane precursors and may employ plasma enhanced atomic layer deposition processes.

US Publ. No. 2013/022496 teaches a method of forming a dielectric film having Si—C bonds on a semiconductor substrate by atomic layer deposition (ALD), includes: (i) adsorbing a precursor on a surface of a substrate; (ii) reacting the adsorbed precursor and a reactant gas on the surface; and (iii) repeating steps (i) and (ii) to form a dielectric film having at least Si—C bonds on the substrate.

PCT Appl. No. WO14134476A1 describes methods for the deposition of films comprising SiCN and SIOCN. Certain methods involve exposing a substrate surface to a first and second precursor, the first precursor having a formula $(X_yH_{3-y}Si)zCH_{4-z}$, $(X_yH_{3-y}Si)(CH_2)(SiX_pH_{2-p})(CH_2)(SiX_yH_{3-y})$, or $(X_yH_{3-y}Si)(CH_2)_n(SiX_yH_{3-y})$, wherein X is a halogen, y has a value of between 1 and 3, and z has a value of between 1 and 3, p has a value of between 0 and 2, and n has a value between 2 and 5, and the second precursor comprising a reducing amine. Certain methods also comprise exposure of the substrate surface to an oxygen source to provide a film comprising carbon doped silicon oxide.

Hirose, Y., Mizuno, K., Mizuno, N., Okubo, S., Okubo, S., Yanagida, K. and Yanagita, K. (2014)) "method of manufacturing semiconductor device, substrate processing apparatus, and recording medium" US Appl. No. 2014287596A describes a method of manufacturing a semiconductor device including forming a thin film containing silicon, oxygen and carbon on a substrate by performing a cycle a predetermined number of times, the cycle including: supplying a precursor gas containing silicon, carbon and a halogen element and having an Si—C bonding, and a first catalytic gas to the substrate; and supplying an oxidizing gas and a second catalytic gas to the substrate.

Hirose, Y., Mizuno, N., Yanagita, K. and Okubo, S. (2014)) "Method of manufacturing semiconductor device, substrate processing apparatus, and recording medium." U.S. Pat. No. 9,343,290 B describes a method of manufacturing a semiconductor device includes forming an oxide film on a substrate by performing a cycle a predetermined number of times. The cycle includes supplying a precursor gas to the substrate; and supplying an ozone gas to the substrate. In the act of supplying the precursor gas, the precursor gas is supplied to the substrate in a state where a catalytic gas is not supplied to the substrate, and in the act of supplying the ozone gas, the ozone gas is supplied to the substrate in a state where an amine-based catalytic gas is supplied to the substrate.

U.S. Pat. No. 9,349,586 B discloses a thin film having a desirable etching resistance and a low dielectric constant.

US Publ. No. 2015/0044881 A describes a method to form a film containing carbon added at a high concentration is formed with high controllability. A method of manufacturing a semiconductor device includes forming a film containing silicon, carbon and a predetermined element on a substrate by performing a cycle a predetermined number of times. The predetermined element is one of nitrogen and oxygen. The cycle includes supplying a precursor gas containing at least two silicon atoms per one mol., carbon and a halogen element and having a Si—C bonding to the substrate, and supplying a modifying gas containing the predetermined element to the substrate.

The reference entitled "Highly Stable Ultrathin Carbosiloxane Films by Molecular Layer Deposition", Han, Z. et al., Journal of Physical Chemistry C, 2013, 117, 19967 teaches growing carbosiloxane film using 1,2-bis[(dimethylamino)dimethylsilyl]ethane and ozone. Thermal stability shows film is stable up to 40° C. with little thickness loss at 60° C.

Liu et al, Jpn. J. Appl. Phys., 1999, Vol. 38, 3482-3486, teaches $H_2$ plasma use on polysilsesquioxane deposited with spin-on technology. The $H_2$ plasma provides stable dielectric constant and improves film thermal stability and $O_2$ ash (plasma) treatment.

Kim et al, Journal of the Korean Physical Society, 2002, Vol. 40, 94, teaches $H_2$ plasma treatment on PECVD carbon doped silicon oxide film improves leakage current density (4-5 orders of magnitude) while dielectric constant increases from 2.2 to 2.5. The carbon doped silicon oxide film after $H_2$ plasma has less damage to during oxygen ashing process.

Posseme et al, Solid State Phenomena, 2005, Vol. 103-104, 337, teaches different $H_2$/inert plasma treatment on carbon doped silicon oxide PECVD film. The k is not improving after $H_2$ plasma treatment suggesting no bulk modification.

The disclosure of the previously identified patents, patent applications and publications is hereby incorporated by reference.

BRIEF SUMMARY OF THE INVENTION

The composition and method described herein overcome the problems of the prior art by providing a composition or formulation for depositing a conformal silicon-containing film forming having one or more of the following properties: i) an etch rate of at least 0.5 times less than thermal silicon oxide (e.g., 0.45 Å/s in 1:99 dilute HF) as measured in dilute hydrofluoric acid and a carbon content of about 10 atomic weight percent (at. %) or greater as measured by X-ray photospectrometry (XPS); ii) dielectric constant and wet etch rate in dilute HF (dHF) less sensitive to damage during oxygen ashing process or exposure to oxygen plasma, Oxygen ash resistance can be quantified by damage thickness after $O_2$ ash is <50 Å measured by dHF dip as well as film dielectric constant after $O_2$ ash lower than 4.0; iii) dielectric constant less than 4.0; and (iv) chlorine impurity in the resulting films less than 2.0 at. %, preferably less than 1.0 at. %, most preferably less than 0.5 at. %. The desirable properties that can be achieved by the instant invention are illustrated in greater detail in the Examples below.

In one particular embodiment, the composition described herein may be used in a method to deposit a carbon doped silicon oxide film using thermal atomic layer deposition (ALD).

In one aspect, the composition for depositing a silicon-containing film comprises: (a) at least one linear or cyclic silicon precursor compound having one Si—C—Si or two Si—C—Si linkages listed in Table 1 and 2.

TABLE 1

Silicon precursors having one Si—C—Si linkage

- 1,1,1,3,3,3-hexachloro-1,3-disilapropane
- 1,1,1,3,3,3-hexachloro-2-methyl-1,3-disilapropane
- 1,1,1,3,3,3-hexachloro-2,2-dimethyl-1,3-disilapropane
- 1,1,1,3,3,3-hexachloro-2-ethyl-1,3-disilapropane

TABLE 2

Silicon precursors having two Si—C—Si linkages

- 1-chloro-1,3-disilacyclobutane
- 1-bromo-1,3-disilacyclobutane
- 1,3-dichloro-1,3-disilacyclobutane
- 1,3-dibromo-1,3-disilacyclobutane
- 1,1-dichloro-1,3-disilacyclobutane
- 1,1-dibromo-1,3-disilacyclobutane
- 1,1,3-trichloro-1,3-disilacyclobutane
- 1,1,3-tribromo-1,3-disilacyclobutane
- 1,1,3,3-tetrachloro-1,3-disilacyclobutane
- 1,1,3,3-tetrabromo-1,3-disilacyclobutane
- 1,3-dichloro-1,3-dimethyl-1,3-disilacyclobutane
- 1,3-bromo-1,3-dimethyl-1,3-disilacyclobutane
- 1,1,1,3,3,5,5,5-octachloro-1,3,5-trisilapentane
- 1,1,1,3,3,5,5,5-octachloro-1,5-dimethyl-1,3,5-trisilapentane
- 1,1,1,5,5,5-hexachloro-3,3-dimethyl-1,3,5-trisilapentane
- 1,1,3,5,5,5-pentachloro-1,3,5-trimethyl-1,3,5-trisilapentane
- 1,1,1,5,5,5-hexachloro-1,3,5-trisilapentane
- 1,1,5,5-tetraachloro-1,3,5-trisilapentane and in at least one aspect of the invention, (b) at least one solvent. In certain embodiments of the composition described herein, exemplary solvents can include, without limitation, ether, tertiary amine, alkyl hydrocarbon, aromatic hydrocarbon, siloxanes, tertiary aminoether, and combinations thereof. In certain embodiments, the difference between the boiling point of the silicon compounds and the boiling point of the solvent is 40° C. or less, less than about 30° C. and in some cases less than about 20° C., preferably less than 10° C.

In another aspect, there is provided a method for depositing a film selected from a carbon-doped silicon oxide film and a carbon-doped silicon oxynitride film onto at least a surface of a substrate comprising:

placing the substrate into a reactor;

heating the reactor to one or more temperatures ranging from about 25° C. to about 550° C.;

introducing into the reactor a precursor comprising at least one compound selected from a silicon precursor listed in Table 1 and 2 and combinations thereof;

introducing into the reactor a nitrogen source to react with at least a portion of the precursor to form a carbon doped silicon nitride film; and treating the carbon doped silicon nitride film with an oxygen source at one or more temperatures ranging from about 25° C. to 1000° C. or from about 100° to 400° C. under conditions sufficient to convert the carbon doped silicon nitride film into the film. In certain embodiments, the carbon doped silicon oxide film or the carbon doped silicon oxynitride film has a carbon content of about 10 atomic weight percent (at. %) or greater as measured by XPS and an etch rate of at least 0.5 times less than thermal silicon oxide as measured in dilute hydrofluoric acid.

If desired, the invention further comprises treating the carbon doped silicon containing film with hydrogen or hydrogen/inert plasma at 25° C. to 600° C.

One aspect of the invention relates to a composition comprising:

(a) at least one linear or cyclic silicon precursor compound having one Si—C—Si or two Si—C—Si linkages selected from the group consisting of 1,1,1,3,3,3-hexachloro-1,3-disilapropane, 1,1,1,3,3,3-hexachloro-2-methyl-1,3-disilapropane, 1,1,1,3,3,3-hexachloro-2,2-dimethyl-1,3-disilapropane, 1,1,1,3,3,3-hexachloro-2-ethyl-1,3-disilapropane, 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,1,3,3,5,5,5-octachloro-1,3,5-trisilapentane, 1,1,1,3,3,5,5,5-octachloro-1,5-dimethyl-1,3,5-trisilapentane, 1,1,1,5,5,5-hexachloro-3,3-dimethyl-1,3,5-trisilapentane, 1,1,3,5,5,5-pentachloro-1,3,5-trimethyl-1,3,5-trisilapentane, 1,1,1,5,5,5-hexachloro-1,3,5-trisilapentane, 1,1,5,5-tetraachloro-1,3,5-trisilapentane; and;

(b) at least one solvent.

Another aspect of the invention relates to a method for forming a carbon doped silicon oxide film having carbon content ranging from 15 at % to 30 at. % via a thermal ALD process, the method comprising:

a) placing one or more substrates comprising a surface feature into a reactor;

b) heating to reactor to one or more temperatures ranging from ambient temperature to about 550° C. and optionally maintaining the reactor at a pressure of 100 torr or less;

c) introducing into the reactor at least one silicon precursor having two Si—C—Si linkages selected from the group consisting of 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,1,3,3,5,5,5-octachloro-1,3,5-trisilapentane, 1,1,1,3,3,5,5,5-octachloro-1,5-dimethyl-1,3,5-trisilapentane, 1,1,1,5,5,5-hexachloro-3,3-dimethyl-1,3,5-trisilapentane, 1,1,3,5,5,5-pentachloro-1,3,5-trimethyl-1,3,5-trisilapentane, 1,1,1,5,5,5-hexachloro-1,3,5-trisilapentane, 1,1,5,5-tetraachloro-1,3,5-trisilapentane;

d) purge with an inert gas;

e) providing a nitrogen source into the reactor to react with the surface to form a carbon doped silicon nitride film;

f) purge with inert gas to remove reaction by-products g) steps c to f are repeated to provide a desired thickness of carbon doped silicon nitride;

h) treating the resulting carbon doped silicon nitride film with an oxygen source at one or more temperatures ranging from about ambient temperature to 1000° C. or from about 100° to 400° C. to convert the carbon doped silicon nitride film into a carbon doped silicon oxide film; and i) providing post-deposition exposing the carbon doped silicon oxide film to a plasma comprising hydrogen.

In one aspect of the invention, the substrate comprises silicon or germanium doped silicon or boron doped silicon or high k material and subsequent to depositing the inventive carbon doped silicon oxide film, a film comprising silicon nitride or silicon oxide is deposited.

A further aspect of the invention relates to a film having a k of less than about 4, a carbon content of at least about 10 at. %, preferably 15 at. % or greater, most preferably 20 at. % or greater based on XPS measurement and, in another aspect the inventive film can be formed according to any of the inventive methods. Since the carbon content is an important factor for reducing the wet etch rate as well as increasing the ash resistance, the carbon content for this invention ranges from 10 at. % to 40 at. %, preferably 15 at. % to 30 at. %, and most preferably 20 at. % to 35 at. % as measured by XPS.

Another aspect of the invention relates to stainless steel container housing the inventive compositions.

The embodiments of the invention may be used alone or in various combinations with each other.

BRIEF DESCRIPTION OF SEVERAL VIEWS OF THE DRAWINGS

FIG. 1 Etching profile comparison for 1,1,1,3,3,3-hexachloro-1,3-disilapropane (HCDSP) and 1,1,3,3-tetrachloro-1,3-disilacyclobutane (TCDSB) carbon doped silicon oxide film after plasma treatment followed by oxygen ash, demonstrating carbon doped silicon oxide film from TCDSB provides more ash resistance than that of HCDSP.

DETAILED DESCRIPTION OF THE INVENTION

Described herein are silicon precursor compounds, and compositions and methods comprising same, to deposit a carbon doped (e.g., having a carbon content of about 10 at. % or greater as measured by XPS) silicon-containing film via a deposition process such as, without limitation, a thermal atomic layer deposition process. The film deposited using the composition and method described herein exhibits an extremely low etch rate such as an etch rate of at least 0.5 times less than thermal silicon oxide as measured in dilute hydrofluoric acid (e.g., about 0.20 Å/s or less or about 0.15 Å/s or less in dilute HF (0.5 wt. %), or an etch rate of at least 0.1 times less than thermal silicon oxide, or an etch rate of at least 0.05 times less than thermal silicon oxide, or an etch rate of at least 0.01 times less than thermal silicon oxide while exhibiting variability in other tunable properties such as, without limitation, density, dielectric constant, refractive index, and elemental composition.

In certain embodiments, the silicon precursor precursors described herein, and methods using same, impart one or more of the following features in the following manner. First, the as-deposited, reactive carbon-doped silicon nitride film is formed using the silicon precursor precursors comprising a Si—C—Si linkage, and a nitrogen source. Without wishing to be bound by any theory or explanation, it is believed that the Si—C—Si linkage from the silicon precursor remains in the resulting as-deposited film and provides a high carbon content of at least 10 at. % or greater as measured by XPS (e.g., about 20 to about 30 at. %, about 10 to about 20 at. % and in some cases about 10 to about 15 at. % carbon). Second, when exposing the as-deposited film to an oxygen source, such as water, either intermittently during the deposition process, as a post-deposition treatment, or a combination thereof, at least a portion or all of the nitrogen content in the film is converted to oxygen to provide a film selected from a carbon-doped silicon oxide or a carbon-doped silicon oxynitride film. The nitrogen in the as-deposited film is released as one or more nitrogen-containing by-products such as ammonia or an amine group.

In this or other embodiments, the final film is porous and has a density of about 1.7 grams/cubic centimeter (g/cc) or less and an etch rate of 0.20 Å/s or less in 0.5 wt. % dilute hydrogen fluoride.

In one aspect, the composition for depositing a silicon-containing film comprises: (a) at least one silicon precursor compound having one Si—C—Si or two Si—C—Si linkages selected from the group consisting of 1,1,1,3,3,3-hexachloro-1,3-disilapropane, 1,1,1,3,3,3-hexachloro-2-methyl-1,3-disilapropane, 1,1,1,3,3,3-hexachloro-2,2-dimethyl-1,3-disilapropane, 1,1,1,3,3,3-hexachloro-2-ethyl-1,3-disilapropane, 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,1,3,3,5,5,5-octachloro-1,3,5-trisilapentane, 1,1,1,3,3,5,5,5-octachloro-1,5-dimethyl-1,3,5-trisilapentane, 1,1,1,5,5,5-hexachloro-3,3-dimethyl-1,3,5-trisilapentane, 1,1,3,5,5,5-pentachloro-1,3,5-trimethyl-1,3,5-trisilapentane, 1,1,1,5,5,5-hexachloro-1,3,5-trisilapentane, 1,1,5,5-tetraachloro-1,3,5-trisilapentane; and; (b) at least one solvent. In certain embodiments of the composition described herein, exemplary solvents can include, without limitation, ether, tertiary amine, alkyl hydrocarbon, aromatic hydrocarbon, tertiary aminoether, siloxanes, and combinations thereof. In certain embodiments, the difference between the boiling point of the compound having one Si—C—Si or two Si—C—Si linkages and the boiling point of the solvent is 40° C. or less. The wt % of silicon precursor compound in the solvent can vary from 1 to 99 wt %, or 10 to 90 wt %, or 20 to 80 wt %, or 30 to 70 wt %, or 40 to 60 wt %, to 50 to 50 wt %. In some embodiments, the composition can be delivered via direct liquid injection into a reactor chamber for silicon-containing film using conventional direct liquid injection equipment and methods.

In one embodiment of the method described herein, the carbon doped silicon oxide film having carbon content ranging from 5 at. % to 20 at. % is deposited using a thermal ALD process and a plasma comprising hydrogen to improve film properties. In this embodiment, the method comprises:

a. placing one or more substrates comprising a surface feature into a reactor;
 b. heating to reactor to one or more temperatures ranging from ambient temperature to about 550° C. and optionally maintaining the reactor at a pressure of 100 torr or less;
 c. introducing into the reactor at least one silicon precursor having one Si—C—Si linkage selected from the group consisting of 1,1,1,3,3,3-hexachloro-1,3-disilapropane, 1,1,1,3,3,3-hexachloro-2-methyl-1,3-disilapropane, 1,1,1,3,3,3-hexachloro-2,2-dimethyl-1,3-disilapropane, 1,1,1,3,3,3-hexachloro-2-ethyl-1,3-disilapropane;
 d. purge with an inert gas thereby removing unreacted silicon precursor and forming a composition comprising the purge gas and silicon precursor;
 e. providing a nitrogen source into the reactor to react with the surface to form a silicon carbonitride films;
 f. purge with inert gas to remove reaction by-products;
 g. steps c to f are repeated to provide a desired thickness of carbon doped silicon nitride;
 h. providing post-deposition treating the carbon doped silicon nitride film with an oxygen source at one or more temperatures ranging from about ambient temperature to 1000° C. or from about 100° to 400° C. to convert the carbon doped silicon nitride film into a carbon doped silicon oxide film either in situ or in another chamber; and
 i. providing post-deposition exposing the carbon doped silicon oxide film to a plasma comprising hydrogen to improve film properties to improve at least one of the films' properties;
 j. optionally post-deposition treating the carbon doped silicon oxide film with a spike anneal at temperatures from 400° to 1000° C. or a UV light source. In this or other embodiments, the UV exposure step can be carried out either during film deposition, or once deposition has been completed.

In one embodiment, the substrate includes at least one feature wherein the feature comprises a pattern trench with aspect ratio of 1:9, opening of 180 nm.

In an embodiment of the method described herein, the carbon doped silicon oxide film having carbon content ranging from 15 at. % to 30 at. % is deposited using a thermal ALD process and a plasma comprising hydrogen to improve film properties. In this embodiment, the method comprises:

a. placing one or more substrates comprising a surface feature into a reactor (e.g., into a conventional ALD reactor);
 b. heating to reactor to one or more temperatures ranging from ambient temperature to about 550° C. and optionally maintaining the reactor at a pressure of 100 torr or less;
 c. introducing into the reactor at least one silicon precursor having two Si—C—Si linkages selected from the group consisting of 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,1,3,3,5,5,5-octachloro-1,3,5-trisilapentane, 1,1,1,3,3,5,5,5-octachloro-1,5-dimethyl-1,3,5-trisilapentane, 1,1,1,5,5,5-hexachloro-3,3-dimethyl-1,3,5-trisilapentane, 1,1,3,5,5,5-pentachloro-1,3,5-trimethyl-1,3,5-trisilapentane, 1,1,1,5,5,5-hexachloro-1,3,5-trisilapentane, 1,1,5,5-tetraachloro-1,3,5-trisilapentane;
 d. purge with an inert gas;
 e. providing a nitrogen source into the reactor to react with the surface to form a carbon doped silicon nitride film;
 f. purge with inert gas to remove reaction by-products;
 g. steps c to f are repeated to provide a desired thickness of carbon doped silicon nitride;
 h. providing post-deposition treating the carbon doped silicon nitride film with an oxygen source at one or more temperatures ranging from about ambient temperature to 1000° C. or from about 100° to 400° C. to convert the carbon doped silicon nitride film into a carbon doped silicon oxide film either in situ or in another chamber;

i. providing post-deposition exposing the carbon doped silicon oxide film to a plasma comprising hydrogen to improve at least one of the films' physical properties.

j. optionally post-deposition treating the carbon doped silicon oxide film with a thermal anneal at temperatures from 400° to 1000° C. or a UV light source. In this or other embodiments, the UV exposure step can be carried out either during film deposition, or once deposition has been completed.

In yet another further embodiment of the method described herein, the silicon containing film is deposited using a thermal ALD process with a catalyst comprising an ammonia or organic amine. In this embodiment, the method comprises:

a. placing one or more substrates comprising a surface feature into a reactor;

b. heating the reactor to one or more temperatures ranging from ambient temperature to about 150° C. and optionally maintaining the reactor at a pressure of 100 torr or less;

c. introducing into the reactor at least one silicon precursor having one or two Si—C—Si linkages selected from the group consisting of 1,1,1,3,3,3-hexachloro-1,3-disilapropane, 1,1,1,3,3,3-hexachloro-2-methyl-1,3-disilapropane, 1,1,1,3,3,3-hexachloro-2,2-dimethyl-1,3-disilapropane, 1,1,1,3,3,3-hexachloro-2-ethyl-1,3-disilapropane, 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,1,3,3,5,5,5-octachloro-1,3,5-trisilapentane, 1,1,1,3,3,5,5,5-octachloro-1,5-dimethyl-1,3,5-trisilapentane, 1,1,1,5,5,5-hexachloro-3,3-dimethyl-1,3,5-trisilapentane, 1,1,3,5,5,5-pentachloro-1,3,5-trimethyl-1,3,5-trisilapentane, 1,1,1,5,5,5-hexachloro-1,3,5-trisilapentane, 1,1,5,5-tetraachloro-1,3,5-trisilapentane and a catalyst;

d. purge with an inert gas e. providing vapors of water into the reactor to react with the precursor as well as a catalyst to form a carbon doped silicon oxide as-deposited film;

f. purge with inert gas to remove reaction by-products;

g. steps c to f are repeated to provide a desired thickness of carbon doped silicon oxide;

h. providing post-deposition exposing the processed film to a plasma comprising hydrogen to improve film properties to improve at least one of the films' properties;

i. optionally post-deposition treating the carbon doped silicon oxide film with a spike anneal at temperatures from 400° to 1000° C. or a UV light source. In this or other embodiments, the UV exposure step can be carried out either during film deposition, or once deposition has been completed.

In this or other embodiments, the catalyst is selected from a Lewis base such as pyridine, piperazine, ammonia, triethylamine or other organic amines. The amount of Lewis base vapors is at least one equivalent to the amount of the silicon precursor vapors during step c.

In certain embodiments, the resulting carbon doped silicon oxide film is exposed to organoaminosilanes or chlorosilanes having Si—Me or Si—H or both to form a hydrophobic thin layer before exposing to hydrogen plasma treatment. Suitable organoaminosilanes include, but not limited to, diethylaminotrimethylsilane, dimethylaminotrimethylsilane, ethylmethylaminotrimethylsilane, t-butylaminotrimethylsilane, iso-propylaminotrimethylsilane, di-isopropylaminotrimethylsilane, pyrrolidinotrimethylsilane, diethylaminodimethylsilane, dimethylaminodimethylsilane, ethylmethylaminodimethylsilane, t-butylaminodimethylsilane, iso-propylaminodimethylsilane, di-isopropylaminodimethylsilane, pyrrolidinodimethylsilane, bis(diethylamino)dimethylsilane, bis(dimethylamino)dimethylsilane, bis(ethylmethylamino)dimethylsilane, bis(di-isopropyllamino)dimethylsilane, bis(iso-propylamino)dimethylsilane, bis(tert-butylamino)dimethylsilane, dipyrrolidinodimethylsilane, bis(diethylamino)diethylsilane, bis(diethylamino)methylvinylsilane, bis(dimethylamino)methylvinylsilane bis(ethylmethylamino)methylvinylsilane, bis(di-isopropyllamino)methylvinylsilane, bis(isopropylamino)methylvinylsilane, bis(tert-butylamino)methylvinylsilane, dipyrrolidinomethylvinylsilane, 2,6-dimethylpiperidinomethylsilane, 2,6-dimethylpiperidinodimethylsilane, 2,6-dimethylpiperidinotrimethylsilane, tris(dimethylamino)phenylsilane, tris(dimethylamino)methylsilane, di-isopropylaminosilane, di-sec-butylaminosilane, chlorodimethylsilane, chlorotrimethylsilane, dichloromethylsilane, and dichlorodimethylsilane.

In another embodiments, the resulting carbon doped silicon oxide film is exposed to alkoxysilanes or cyclic alkoxysilanes having Si—Me or Si—H or both to form a hydrophobic thin layer before exposing to hydrogen plasma treatment. Suitable alkoxysilanes or cyclic alkoxysilanes include, but not limited to, diethoxymethylsilane, dimethoxymethylsilane, diethoxydmethylsilane, dimethoxydmethylsilane, 2,4,6,8-Tetramethylcyclotetrasiloxane, or octamethylcyclotetrasiloxane. Without wishing to be bound by any theory or explanation, it is believed that the thin layer formed by the organoaminosilanes or alkoxysilanes or cyclic alkoxysilanes may convert into dense carbon doped silicon oxide during plasma ashing process, further boosting the ashing resistance.

In another embodiment, a vessel for depositing a silicon-containing film comprising one or more silicon precursor compounds described herein. In one particular embodiment, the vessel comprises at least one pressurizable vessel (preferably of stainless steel having a design such as disclosed in U.S. Pat. Nos. 7,334,595; 6,077,356; 5,069,244; and 5,465,766 the disclosure of which is hereby incorporated by reference. The container can comprise either glass (borosilicate or quartz glass) or type 316, 316L, 304 or 304L stainless steel alloys (UNS designation S31600, S31603, S30400 S30403) fitted with the proper valves and fittings to allow the delivery of one or more precursors to the reactor for a CVD or an ALD process. In this or other embodiments, the silicon precursor is provided in a pressurizable vessel comprised of stainless steel and the purity of the precursor is 98% by weight or greater or 99.5% or greater which is suitable for the semiconductor applications. The silicon precursor compounds are preferably substantially free of metal ions such as, $Al^{3+}$ ions, $Fe^{2+}$, $Fe^{3+}$, $Ni^{2+}$, $Cr^{3+}$. As used herein, the term "substantially free" as it relates to $Al^{3+}$ ions, $Fe^{2+}$, $Fe^{3+}$, $Ni^{2+}$, $Cr^{3+}$ means less than about 5 ppm (by weight), preferably less than about 3 ppm, and more preferably less than about 1 ppm, and most preferably about 0.1 ppm. In certain embodiments, such vessels can also have means for mixing the precursors with one or more additional precursor if desired. In these or other embodiments, the contents of the vessel(s) can be premixed with an additional precursor. Alternatively, the silicon precursor is and/or other precursor can be maintained in separate vessels or in a single vessel having separation means for maintaining the silicon precursor is and other precursor separate during storage.

The silicon-containing film is deposited upon at least a surface of a substrate such as a semiconductor substrate. In the method described herein, the substrate may be comprised of and/or coated with a variety of materials well known in the art including films of silicon such as crystalline silicon or amorphous silicon, silicon oxide, silicon nitride, amorphous carbon, silicon oxycarbide, silicon oxynitride, silicon carbide, germanium, germanium doped silicon, boron doped silicon, metal such as copper, tungsten, aluminum, cobalt, nickel, tantalum), metal nitride such as titanium nitride, tantalum nitride, metal oxide, group III/V metals or metalloids such as GaAs, InP, GaP and GaN, and a combination thereof. These coatings may completely coat the semi-conductor substrate, may be in multiple layers of various materials and may be partially etched to expose underlying layers of material. The surface may also have on it a photoresist material that has been exposed with a pattern and developed to partially coat the substrate. In certain embodiments, the semiconductor substrate comprising at least one surface feature selected from the group consisting of pores, vias, trenches, and combinations thereof. The potential application of the silicon-containing films include but not limited to low k spacer for FinFET or nanosheet, sacrificial hard mask for self aligned patterning process (such as SADP, SAQP, or SAOP).

The deposition method used to form the silicon-containing films or coatings are deposition processes. Examples of suitable deposition processes for the method disclosed herein include, but are not limited to, a chemical vapor deposition or an atomic layer deposition process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. As used herein, the term "thermal atomic layer deposition process" refers to atomic layer deposition process at substrate temperatures ranging from room temperature to 600° C. without in situ or remote plasma. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator.

In one embodiment, the silicon-containing film is deposited using an ALD process. In another embodiment, the silicon-containing film is deposited using a CCVD process. In a further embodiment, the silicon-containing film is deposited using a thermal ALD process. The term "reactor" as used herein, includes without limitation, reaction chamber or deposition chamber.

In certain embodiments, the method disclosed herein avoids pre-reaction of precursor(s) by using ALD or CCVD methods that separate the precursor(s) prior to and/or during the introduction to the reactor. In this connection, deposition techniques such as ALD or CCVD processes are used to deposit the silicon-containing film. In one embodiment, the film is deposited via an ALD process in a typical single wafer ALD reactor, semi-batch ALD reactor, or batch furnace ALD reactor by exposing the substrate surface alternatively to the one or more the silicon-containing precursor, oxygen source, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases. In another embodiment, each reactant including the silicon precursor and reactive gas is exposed to a substrate by moving or rotating the substrate to different sections of the reactor and each section is separated by inert gas curtain, i.e. spatial ALD reactor or roll to roll ALD reactor.

Depending upon the deposition method, in certain embodiments, the silicon precursors described herein and optionally other silicon-containing precursors may be introduced into the reactor at a predetermined molar volume, or from about 0.1 to about 1000 micromoles. In this or other embodiments, the precursor may be introduced into the reactor for a predetermined time period. In certain embodiments, the time period ranges from about 0.001 to about 500 seconds.

In certain embodiments, the silicon-containing films deposited using the methods described herein are formed in the presence of a catalyst in combination with an oxygen source, reagent or precursor comprising oxygen, i.e. water vapors. An oxygen source may be introduced into the reactor in the form of at least one oxygen source and/or may be present incidentally in the other precursors used in the deposition process. Suitable oxygen source gases may include, for example, water ($H_2$) (e.g., deionized water, purified water, distilled water, water vapor, water vapor plasma, oxygenated water, air, a composition comprising water and other organic liquid), oxygen ($O_2$), oxygen plasma, ozone ($O_3$), nitric oxide (NO), nitrogen dioxide ($NO_2$), carbon monoxide (CO), a plasma comprising water, a plasma comprising water and argon, hydrogen peroxide, a composition comprising hydrogen, a composition comprising hydrogen and oxygen, carbon dioxide ($CO_2$), air, and combinations thereof. In certain embodiments, the oxygen source comprises an oxygen source gas that is introduced into the reactor at a flow rate ranging from about 1 to about 10000 square cubic centimeters (sccm) or from about 1 to about 1000 sccm. The oxygen source can be introduced for a time that ranges from about 0.1 to about 100 seconds. The catalyst is selected from a Lewis base such as pyridine, piperazine, trimethylamine, tert-butylamine, diethylamine, trimethylamine, ethylenediamine, ammonia, or other organic amines.

In embodiments wherein the film is deposited by an ALD or a cyclic CVD process, the precursor pulse can have a pulse duration that is greater than 0.01 seconds, and the oxygen source can have a pulse duration that is less than 0.01 seconds, while the water pulse duration can have a pulse duration that is less than 0.01 seconds.

In certain embodiments, the oxygen source is continuously flowing into the reactor while precursor pulse and plasma are introduced in sequence. The precursor pulse can have a pulse duration greater than 0.01 seconds while the plasma duration can range between 0.01 seconds to 100 seconds.

In certain embodiments, the silicon-containing films comprise silicon and nitrogen. In these embodiments, the silicon-containing films deposited using the methods described herein are formed in the presence of nitrogen-containing source. A nitrogen-containing source may be introduced into the reactor in the form of at least one nitrogen source and/or may be present incidentally in the other precursors used in the deposition process.

Suitable nitrogen-containing or nitrogen source gases may include, for example, ammonia, hydrazine, monoalkylhydrazine, symmetrical or unsymmetrical dialkylhydrazine, organoamines such as methylamine, ethylamine, ethylenediamine, ethanolamine, piperazine, N,N'-dimethylethylenediamine, imidazolidine, cyclotrimethylenetriamine, and combination thereof.

In certain embodiments, the nitrogen source is introduced into the reactor at a flow rate ranging from about 1 to about 10000 square cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process using both a nitrogen and oxygen source, the precursor pulse can have a pulse duration that is greater than 0.01 seconds, and the nitrogen source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and combinations thereof. In certain embodiments, a purge gas such as Ar is supplied into the reactor at a flow rate ranging from about 10 to about 10000 sccm for about 0.1 to 1000 seconds, thereby purging the unreacted material and any byproduct that may remain in the reactor.

The respective step of supplying the precursors, oxygen source, the nitrogen-containing source, and/or other precursors, source gases, and/or reagents may be performed by changing the time for supplying them to change the stoichiometric composition of the resulting film.

Energy is applied to the at least one of the precursor, nitrogen-containing source, reducing agent, other precursors or combination thereof to induce reaction and to form the film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof.

In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

Throughout the description, the term "ALD or ALD-like" refers to a process including, but not limited to, the following processes: a) each reactant including silicon precursor and reactive gas is introduced sequentially into a reactor such as a single wafer ALD reactor, semi-batch ALD reactor, or batch furnace ALD reactor; b) each reactant including silicon precursor and reactive gas is exposed to a substrate by moving or rotating the substrate to different sections of the reactor and each section is separated by inert gas curtain, i.e. spatial ALD reactor or roll to roll ALD reactor.

The silicon precursors and/or other silicon-containing precursors may be delivered to the reaction chamber, such as a CVD or ALD reactor, in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In this or other embodiments, it is understood that the steps of the methods described herein may be performed in a variety of orders, may be performed sequentially or concurrently (e.g., during at least a portion of another step), and any combination thereof. The respective step of supplying the precursors and the nitrogen-containing source gases may be performed by varying the duration of the time for supplying them to change the stoichiometric composition of the resulting silicon-containing film.

In a still further embodiment of the method described herein, the film or the as-deposited film is subjected to a treatment step. The treatment step can be conducted during at least a portion of the deposition step, after the deposition step, and combinations thereof. Exemplary treatment steps include, without limitation, treatment via high temperature thermal annealing; plasma treatment; ultraviolet (UV) light treatment; laser; electron beam treatment and combinations thereof to affect one or more properties of the film. The films deposited with the silicon precursors having one or two Si—C—Si linkages described herein, when compared to films deposited with previously disclosed silicon precursors under the same conditions, have improved properties such as, without limitation, a wet etch rate that is lower than the wet etch rate of the film before the treatment step or a density that is higher than the density prior to the treatment step. In one particular embodiment, during the deposition process, as-deposited films are intermittently treated. These intermittent or mid-deposition treatments can be performed, for example, after each ALD cycle, after a certain number of ALD, such as, without limitation, one (1) ALD cycle, two (2) ALD cycles, five (5) ALD cycles, or after every ten (10) or more ALD cycles.

In an embodiment wherein the film is treated with a high temperature annealing step, the annealing temperature is at least 100° C. or greater than the deposition temperature. In this or other embodiments, the annealing temperature ranges from about 400° C. to about 1000° C. In this or other embodiments, the annealing treatment can be conducted in a vacuum (<760 Torr), inert environment or in oxygen containing environment (such as $H_2O$, $N_2O$, $NO_2$ or $O_2$)

In an embodiment wherein the film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment where in the film is treated with a plasma, passivation layer such as $SiO_2$ or carbon doped $SiO_2$ is deposited to prevent chlorine and nitrogen contamination from penetrating film in the subsequent plasma treatment. The passivation layer can be deposited using atomic layer deposition or cyclic chemical vapor deposition.

In an embodiment wherein the film is treated with a plasma, the plasma source is selected from the group consisting of hydrogen plasma, plasma comprising hydrogen and helium, plasma comprising hydrogen and argon. Hydrogen plasma lowers film dielectric constant and boost the damage resistance to following plasma ashing process while still keeping the carbon content in the bulk almost unchanged.

Throughout the description, the term "ALD or ALD-like" refers to a process including, but not limited to, the following processes: a) each reactant including silicon precursor and reactive gas is introduced sequentially into a reactor such as a single wafer ALD reactor, semi-batch ALD reactor, or batch furnace ALD reactor; b) each reactant including silicon precursor and reactive gas is exposed to a substrate by moving or rotating the substrate to different sections of the reactor and each section is separated by inert gas curtain, i.e. spatial ALD reactor or roll to roll ALD reactor.

Throughout the description, the term "ashing" refers to a process to remove the photoresist or carbon hard mask in semiconductor manufacturing process using a plasma comprising oxygen source such as $O_2$/inert gas plasma, $O_2$ plasma, $CO_2$ plasma, CO plasma, $H_2/O_2$ plasma or combination thereof.

Throughout the description, the term "damage resistance" refers to film properties after oxygen ashing process. Good or high damage resistance is defined as the following film properties after oxygen ashing: film dielectric constant lower than 4.5; carbon content in the bulk (at more than 50 Å deep into film) is within 5 at. % as before ashing; Less than 50 Å of the film is damaged, observed by differences in dilute HF etch rate between films near surface (less than 50 Å deep) and bulk (more than 50 Å deep).

Throughout the description, the term "alkyl hydrocarbon" refers a linear or branched $C_1$ to $C_{20}$ hydrocarbon, cyclic $C_6$ to $C_{20}$ hydrocarbon. Exemplary hydrocarbon includes, but not limited to, heptane, octane, nonane, decane, dodecane, cyclooctane, cyclononane, cyclodecane.

Throughout the description, the term "aromatic hydrocarbon" refers a $C_6$ to $C_{20}$ aromatic hydrocarbon. Exemplary aromatic hydrocarbon n includes, but not limited to, toluene, mesitylene.

Throughout the description, the term "catalyst" refers a Lewis base in vapor phase which can catalyze surface reaction between hydroxyl group and Si—Cl bond during thermal ALD process. Exemplary catalysts include, but not limited to, at least one of a cyclic amine-based gas such as aminopyridine, picoline, lutidine, piperazine, piperidine, pyridine or an organic amine-based gas methylamine, dimethylamine, trimethylamine, ethylamine, diethylamine, triethylamine, propylamine, iso-propylamine, di-propylamine, di-iso-propylamine, tert-butylamine.

Throughout the description, the term "organic amines" refers a primary amine, secondary amine, tertiary amine having $C_1$ to $C_{20}$ hydrocarbon, cyclic $C_6$ to $C_{20}$ hydrocarbon. Exemplary organic amines include, but not limited to, methylamine, dimethylamine, trimethylamine, ethylamine, diethylamine, triethylamine, propylamine, iso-propylamine, di-propylamine, di-iso-propylamine, tert-butylamine.

Throughout the description, the term "siloxanes" refer a linear, branched, or cyclic liquid compound having at least one Si—O—Si linkages and $C_4$ to $C_{20}$ carbon atoms. Exemplary siloxanes includes, but not limited to, tetramethyldisiloxane, hexamethyldisiloxane (HMDSO), 1,1,1,3,3,5,5,5-octamethyltrisiloxane, octamethylcyclotetrasiloxane (OMCTS).

Throughout the description, the term "step coverage" as used herein is defined as a percentage of two thicknesses of the deposited film in a structured or featured substrate having either vias or trenches or both, with bottom step coverage being the ratio (in %):thickness at the bottom of the feature is divided by thickness at the top of the feature, and middle step coverage being the ratio (in %):thickness on a sidewall of the feature is divided by thickness at the top of the feature. Films deposited using the method described herein exhibit a step coverage of about 80% or greater, or about 90% or greater which indicates that the films are conformal.

The following examples illustrate certain aspects of the instant invention and do not limit the scope of the appended claims.

EXAMPLES

General Film Deposition

Film depositions were performed in a lab scale atomic layer deposition (ALD) reactor using a silicon precursor and ammonia as nitrogen source ammonia. The ALD cycle steps and process conditions are provided in the following Table 3:

TABLE 3

ALD Cycle Steps and Process Conditions

| Steps | Descriptions | Time | Notes |
|---|---|---|---|
| 1 | Insert Si substrates into a reactor | | |
| 2 | Heat substrates to desired temperature | ~1-2 hours | T = 300-500° C. |
| 3 | Close throttle valve | 2 seconds (s) | Throttle valve is closed to increase residence time |
| 4 | Deliver silicon precursor dose | 2 s | Vapor draw; vapor pressure is 14-18 Torr |
| 5 | Deliver silicon precursor dose | 2 s | |
| 6 | Deliver silicon precursor dose | 2 s | After 3 doses of Si precursor, |
| 7 | Open throttle valve | 2 s | |
| 8 | Flow $N_2$ to purge the reactor | 6 s | $N_2$ flow is 5 lpm |
| 9 | Evacuate the reactor to base pressure | 6 s | Base pressure is <1 mTorr |
| 10 | Flow $NH_3$ | 24 s | Pressure is set to 5 Torr; $NH_3$ flow is 100 sccm |
| 9 | Flow $N_2$ to purge the reactor | 6 s | $N_2$ flow is 5 lpm |
| 10 | Evacuate the reactor to base pressure | 6 s | Base pressure is <1 mTorr |
| 11 | Remove Si sample from the reactor | | |

During the deposition, steps 3 to 10 are repeated for a number of cycles of up to 2000 times to get a desired thickness of the as-deposited carbon doped silicon nitride films. The resulting as-deposited films were subjected to either an in-situ (annealing performed inside the reactor on the as-deposited film) or ex-situ annealing (annealing outside or in a separate chamber) to convert into the films into a carbon doped silicon oxide films. Typical annealing conditions performed were as follows: moisture annealing was performed under vacuum at 30 Torr; air annealing was performed on a hot plate at ambient temperature (e.g., 25° C.) or about 300° C.

Standard hydrogen containing plasma were used to treat a carbon doped silicon oxide film. The $H_2$ plasma treatment parameters are:

a. $H_2$ only plasma:
  Plasma frequency=13.56 MHz
  $H_2$ flow=135 sccm
  Chamber pressure=2 Torr
  Time=5 minutes
b. $H_2$/Ar plasma
  Plasma frequency=13.56 MHz
  $H_2$ flow=65 sccm
  Ar flow=65 sccm
  Chamber pressure=2 Torr
  Time=5 minutes Refractive index and thickness were measured directly after deposition using an ellipsometer at 632.8 nm. Bulk film composition was characterized using X-Ray Photoelectron Spectroscopy (XPS) at few nanometer (2-5 nm) down from the surface in order to eliminate effect of adventitious carbon. Film density was characterized using X-Ray Reflectometry (XRR).

Wet etch rate process was performed under two different concentration of dilute hydrofluoric acid (dHF), 1:199 49% HF and DI water as well as 1:99 49% HF and DI water). The more dilute HF concentration increases measurement accuracy for damaged layer. During the process, a thermal silicon oxide film was etched at the same time used to ensure etch solution consistency.

Oxygen ashing process was performed at room temperature using commercial plasma asher PVA TePLA M4L. The process parameters are as follow: power=100-200 W; He/$O_2$=1:3; pressure=600 mTorr. Film dielectric constant (k) is calculated from C-V curve measured using MDC 802b Mercury Probe connected to HP4284 LCR meter. Measurement was done in a front-contact mode, which liquid metal (mercury) was used to form two electrically conductive contacts.

Example 1: Low Dielectric Constant and High Oxygen Ash Resistance of Carbon Doped Silicon Oxide Film Via Thermal ALD Deposition Carbon doped silicon oxide film was deposited using thermal ALD process using 1,1,3,3-tetrachlorodisilacyclobutane (TCDSB) and 1,1,1,3,3,3-hexachloro-1,3-disilapropane (HCDSP) and ammonia at 300° C. as described in Table 3.

After deposition the film was then further treated ex-situ for 3 hours at 300° C. in air.

TABLE 4

Film composition for carbon doped silicon oxide film deposited from 1,1,3,3-tetrachloro-1,3-disilcyclobutane and ammonia followed by annealing measured by XPS

| Si precursor | C | N | O | Si | Cl |
|---|---|---|---|---|---|
| 1,1,1,3,3,3-hexachloro-1,3-disilapropane (HCDSP) | 9.5% | 1.1% | 56.8% | 32.6% | ND |
| 1,1,3,3-tetrachloro-disilacyclobutane (TCDSB) | 27.5% | 1.2% | 39.2% | 40.3% | ND |

Table 4. shows film composition comparison between film deposited from HCDSP and TCDSB. The TCDSB film has a relatively large carbon content compared to HCDSP, demonstrating TCDSM is a better silicon precursor to introduce more carbon than HCDSP.

The dHF etch rate for thermal silicon oxide reference etch rate is 0.48±0.02 Å/s. the etch rate for HCDSP and TCDSB films are 0.10 Å/s and <0.02 Å/s consecutively.

The TDCSB film etch rate is below detection, limit of our measurement. Lower TDCSB film dilute HF etch rate (>5× lower) is consistent with higher carbon content in the film.

Film dielectric constant for either carbon doped silicon oxide film deposited from HCDSP or TCDSB are greater than 5.

The resulted carbon doped silicon oxide film deposited from HCDSP or TCDSB films were further treated with hydrogen plasma using 300 mm commercial PEALD tool using $H_2$/Ar plasma using the conditions as aforementioned. Both HCDSP and TCDSB film have dielectric constant reduced to 3.5 and 3.4 respectively after plasma treatment, demonstrating plasma comprising hydrogen is an effective way to reduce dielectric constant.

The films were then exposed to standard oxygen ash followed by dilute HF dip to determine damage. Referring now to FIG. 1, FIG. 1 shows film thickness removed as function of time when dipping in dilute HF.

Both HCDSP and TCDSB films shows fast etch rate in the beginning before slowing down, indicating surface damage from oxygen ash. Oxygen ash oxidizes carbon from the film, hence, causing fast etch rate. Etch rate profile suggests damaged layer of 27 Å for TCDSB film and 39 Å for HCDSP film, suggesting TCDSB film is more oxygen ash resistance than HCDSP film under the same etching conditions.

Example 2. Step Coverage of Carbon Doped Silicon Oxide Film from 1,1,3,3-tetrachloro-1,3-disilacyclobutane Carbon doped silicon oxide film on pattern structure was deposited from 1,1,3,3-tetrachloro-1,3-disilacyclobutane and ammonia at 300° C. as described in Table 3 followed by ex-situ treatment to 300° C. for 3 hours in air environment.

Scanning electron microscope (SEM) was performed on the trench structure with aspect ratio of 1:9 and trench opening of 180 nm.

TABLE 5

Surface coverage of carbon doped silicon oxide film deposited from 1,1,3,3-tetrachloro-1,3-disilacyclobutane

| | Top | ¼ from top | Middle | ¾ from top | Bottom |
|---|---|---|---|---|---|
| Thickness (Å) | 456 Å | 476 Å | 473 Å | 456 Å | 476 Å |

The step coverage, shown in Table 5, for carbon doped silicon oxide film deposited from 1,1,3,3-tetrachloro-1,3-disilacyclobutane is >99%.

Example 3. Deposition of Silicon-Containing Film via Thermal ALD Deposition Using 1,1,3,3-tetrachloro-1,3-disilacyclobutane Silicon-containing films were deposited from 1,1,3,3-tetrachloro-1,3-disilacyclobutane and ammonia at substrate temperature of 500° C. using the process steps described in Table 3 and stored in ambient.

Film properties such as XPS and wet etch rate in dilute HF were obtained approximately a week after film deposition. The results of these tests are provided in Table 6.

TABLE 6

Film composition and WER of ALD films

| Temperature (° C.) | % O | % N | % C | % Cl | % Si | dHF WER relative to thermal oxide |
|---|---|---|---|---|---|---|
| 500 | 20.1 | 18.1 | 23.9 | 0.4 | 37.6 | 0.12 |

Referring to Table 6, the XPS data shows that the carbon doped silicon oxide had little chlorine content (e.g., less than 0.5 at. %). The film deposited at 500° C. is has more nitrogen content compared to 300° C. while maintaining similar amount of carbon in the film. It is believed that at the lower deposition temperature of 300° C., the process may provide more $Si-NH_2$ or $Si-NH-Si$ fragments that are susceptible to oxidation. Deposition at the higher 500° C. temperature, on the other hand, may provide enough energy to form a stronger $Si-N_x$ network which is more resistant to oxidation.

Example 4. In-Situ Annealing of Carbon Doped Silicon Oxide Film Deposited from 1,1,3,3-tetrachloro-1,3-disilacyclobutane Carbon doped silicon oxide film was deposited using 1,1,3,3-tetrachloro-1,3-disilacyclobutane and ammonia at 300° C. as described in Table 3. In-situ $H_2O$ vapor treatment was performed on the film using the following parameters: $H_2O$ vapor draw; $H_2O$ canister temperature=50° C.; Chamber pressure=30 Torr; T=300° C.
Film growth per cycle was 0.48 Å/cycle. The resulting film has refractive index of 1.55 and density of 1.55 g/cc. The film composition measured by XPS is O=39.0%, N=2.6%, C=25.1% and Si=33.2%. No chlorine detected in the film.

Example 5. Oxygen Ash Resistance of Carbon Doped Silicon Oxide Film Deposited Via Thermal ALD Deposition Using 1,1,3,3-tetrachloro-1,3-disilacyclobutane and Ammonia Followed by Thermal Annealing and Plasma Treatment Carbon doped silicon oxide film was deposited using 1,1,3,3-tetrachloro-1,3-disilacyclobutane and ammonia at 300° C. as described in Table 3 followed by thermal treatment at 300° C. in air. The carbon doped silicon oxide film was further heated in nitrogen at 200-400° C., 5 Torr, for 1 hour prior to $H_2/Ar$ plasma treatment described previously. The film was then exposed to oxygen ash followed by dilute HF etch to determine damaged thickness.
Film dielectric constant is shown in Table 7 while $O_2$ ash damaged thickness are shown in Table 8.

TABLE 7

Dielectric constant of carbon doped silicon oxide film by $H_2/Ar$ plasma treatment.

| | Dielectric constant after $H_2/Ar$ plasma treatment (before $O_2$ ash) |
|---|---|
| $H_2/Ar$ plasma treatment only | 3.6 |
| 200° C. anneal before $H_2/Ar$ plasma treatment | 2.8 |
| 300° C. anneal before $H_2/Ar$ plasma treatment | 2.8 |
| 400° C. anneal before $H_2/Ar$ plasma treatment | 3.2 |

TABLE 8

Damaged thickness of carbon doped silicon oxide film after exposed to $O_2$ ash.

| | Damaged thickness after $O_2$ ash (Å) |
|---|---|
| $H_2/Ar$ plasma treatment only | 30 |
| 200° C. anneal before $H_2/Ar$ plasma treatment | 32 |
| 300° C. anneal before $H_2/Ar$ plasma treatment | 27 |
| 400° C. anneal before $H_2/Ar$ plasma treatment | 31 |

Additional annealing prior to $H_2/Ar$ plasma treatment shows lower dielectric constant (k=2.8-3.2) over sample only treated with $H_2/Ar$ plasma (k=3.6). The film has oxygen ash damaged thickness of 27-32 Å.

Example 6. Carbon Doped Silicon Oxide Film Using 1,1,3,3-tetrachloro-1,3-disilacyclobutane and Ammonia at 300° C. Followed by High Temperature Annealing Carbon doped silicon oxide film was deposited using 1,1,3,3-tetrachloro-1,3-disilacyclobutane as the silicon precursor and ammonia at 300° C. in ALD mode using 300 mm commercial cross flow reactor. The ALD steps 2 to 8, shown in Table 9, are repeated to get desired thickness.

TABLE 9

ALD steps of carbon doped silicon oxide film deposition

| Steps | Descriptions | Time | Notes |
|---|---|---|---|
| 1 | Insert Si substrates into a reactor | | |
| 2 | Heat substrates to desired temperature | 30 minutes | T =300° C. |
| 3 | Flow the silicon precursor | 1 seconds (s) | Vapor draw; vapor pressure is 14-18 Torr Inner chamber Ar = 300 sccm, 8 Torr; Outer chamber Ar = 500 sccm, 7.5 Torr |
| 4 | Soak Si precursor | 3 s | Ar gas and precursor flow is stopped. Throttle valve close while maintaining chambers pressure. |
| 5 | Flow Ar to purge precursor | 10 s | Inner chamber Ar = 300 sccm, 8 Torr; Outer chamber Ar = 500 sccm, 7.5 Torr |
| 6 | Flow $NH_3$ | 25 s | $NH_3$ = 100 sccm Inner chamber Ar = 300 sccm, 8 Torr; Outer chamber Ar = 500 sccm, 7.5 Torr |
| 7 | Flow Ar to purge precursor | 10 s | Inner chamber Ar = 300 sccm, 8 Torr; Outer chamber Ar = 500 sccm, 7.5 Torr |

TABLE 9-continued

ALD steps of carbon doped silicon oxide film deposition

| Steps | Descriptions | Time | Notes |
|---|---|---|---|
| 8 | Remove Si sample from the reactor | | |

The as-deposited sample was left in ambient convert into carbon doped silicon oxide film. The growth per cycle (GPC) of the films are 0.45 Å/cycle.

The carbon doped silicon oxide film was further treated at 300° C. under nitrogen atmosphere for 1 hour followed by hydrogen-containing plasma treatment (either $H_2$ only plasma or $H_2$/Ar plasma) as described previously.

After plasma treatment, the film was exposed to $O_2$ ash followed by dilute HF to determine damaged thickness. The dielectric constant and damaged thickness after $O_2$ ash are shown in Table 10.

TABLE 10

Dielectric constant of carbon doped silicon oxide film and damaged thickness after $O_2$ ash

| Treatment | Before treatment dielectric constant (k) | After plasma (before $O_2$ ash) dielectric constant (k) | After $O_2$ ash and dHF etch dielectric constant (k) | $O_2$ ash damaged thickness (Å) |
|---|---|---|---|---|
| $H_2$ only plasma | 5.7 | 3.5 | 3.5 | 33 Å |
| $H_2$/Ar plasma | 5.7 | 2.8 | 3.2 | 31 Å |

The process demonstrated carbon doped silicon oxide film with high oxygen resistance and low-k before and after oxygen ash process. High oxygen resistance indicates by low damage thickness as well as low k after oxygen ash (k<4.0)

Example 7. Step Coverage of Silicon Containing Film after Plasma Treatment

Carbon doped silicon oxide film was deposited using 1,1,3,3-tetrachloro-1,3-disilacyclobutane and ammonia at 300° C. in ALD mode using 300 mm commercial cross flow reactor followed by $H_2$/Ar plasma as described in Example 6. The substrate used was patterned wafer with aspect ratio of 1:9 and opening of 180 nm.

Transmission Electron Microscope (TEM) was used to determine surface coverage. Table 11 shows film thickness at various locations in the structure.

TABLE 11

Thickness of carbon doped silicon oxide deposited from 1,1,3,3-tetrachloro-1,3-disilacyclobutane followed by $H_2$/Ar plasma treatment

| Top | ¼ from top | Middle | ¾ from top | Bottom |
|---|---|---|---|---|
| 355 Å | 353 Å | 360 Å | 362 Å | 345 Å |

Film step coverage is >97%.

Example 8. Chemical Treatment of Carbon Containing Film Deposited from 1,1,3,3-tetrachloro-1,3-disilacyclobutane and Ammonia The carbon doped silicon oxide film deposited from 1,1,3,3-tetrachloro-1,3-disilacyclobutane and ammonia at 300° C. as described in Table 9 was annealed at 300° C. in inert for 1 hour followed by exposure to chemical treatment using diethylaminotrimethylsilane. The chemical treatment parameters are:
T=300° C.; Time=5 min and 25 min; Chamber Pressure=1 Torr As control, the film was annealed only at 300° C. without any chemical exposure.

After treatment, film dielectric constant is measured and shown in Table 12.

TABLE 12

Film dielectric constant after diethylaminotrimethylsilane treatment

| Temperature (° C.) | Time (minutes) | Dielectric constant (k) |
|---|---|---|
| No chemical treatment, anneal only at 300° C. | 25 | 5.5 |
| 300 | 5 | 2.9 |
| 300 | 25 | 2.7 |

The chemical treatment shows improvement in film dielectric constant, from 5.5 to less than 3.0.

Example 9. Deposition of Carbon Containing Silicon Film Using 1,1,3,3-tetrachlorodsilacyclobutane in Octane and Ammonia A solution of 20 wt. % of 1,1,3,3-tetrachloro-1,3-disilacyclobutane in octane was used for film deposition. The chemical was delivered using direct liquid injection (canister temperature=60° C., Ar flow through the vaporizer was 100 sccm. Liquid flow rate was ~200 mg/min). Vaporizer temperature was 70° C.

The deposition process comprised of the following steps:

TABLE 13

Steps used to deposit silicon containing film using 1,1,3,3-tetrachloro-1,3-disilacyclobutane solution

| Steps | Descriptions | Time | Notes |
|---|---|---|---|
| 1 | Insert Si substrates into a reactor | | |
| 2 | Heat substrates to desired temperature | 5 minutes | T = 300° C. |
| 3 | Flow 1,1,3,3-tetrachloro-1,3-disilacyclobutane 20% in octane | 2 seconds | Ch P = 8~10 Torr |
| 4 | Soak Si precursor | 5 s | Ar gas and precursor flow were stopped. Throttle valve closed while maintaining chambers pressure. |
| 5 | Flow Ar to purge precursor | 10 s | |
| 6 | Flow $NH_3$ | 15 s | $NH_3$ = 500 sccm, Chamber pressure = 15 Torr |
| 7 | Soak $NH_3$ | 20 s | $NH_3$ flow stopped. Throttle valve closed |
| 8 | Flow Ar to purge $NH_3$ | 10 s | |
| 9 | Flow $H_2O$ vapor | 1 hour | 300° C, chamber pressure = ~30 Torr |
| 10 | Remove Si substrate from the reactor | | |

Steps 3 to 4 were repeated 5 times before moving to step 5, and steps 3 to 8 were repeated multiple times to get desired thickness. Film composition analyzed by XPS are Si=35.7%; O=36.5%; C=23.0%; N=4.5%; Cl=0.3%.

The deposited film was further annealed in inert environment at 300° C. for 1 hour followed by $H_2$/Ar plasma treatment.

Treated films were exposed to standard $O_2$ ash and dipped into dilute HF to determine damaged thickness. The damaged thickness after $O_2$ ash are 38 Å and 37 Å for film treated with $H_2$ only plasma and $H_2/Ar$ plasma consecutively.

Example 10. High Carbon Content Si Oxide Film from In-Situ Processing

A solution of 20 wt. % of 1,1,3,3-tetrachloro-1,3-disilacyclobutane in octane was used for film deposition. The chemical was delivered using direct liquid injection (canister temperature=60° C., Ar flow through the vaporizer was 100 sccm. Liquid flow rate was ~200 mg/min). Vaporizer temperature was 70° C.

The deposition process comprised of the following steps:

TABLE 14

Steps used to deposit silicon containing film using 1,1,3,3-tetrachloro-1,3-disilacyclobutane solution

| Steps | Descriptions | Time | Notes |
|---|---|---|---|
| 1 | Insert Si substrates into a reactor | | |
| 2 | Heat substrates to desired temperature | 5 minutes | T = 300° C. |
| 3 | Flow 1,1,3,3-tetrachloro-1,3-disilacyclobutane and pyridine, co-injection | 0.5 second | Chamber pressure = 5 Torr Precursor temperature = 70° C., Ar carrier gas = 25 sccm Nitrogen for pressure control = 200 sccm Ar for pressure control = 50 sccm |
| 4 | Flow inert gas to purge unreacted precursors | 15 s | Nitrogen = 200 sccm Ar = 50 sccm |
| 5 | Flow $H_2O$ and pyridine, co-injection | 3 s | Chamber pressure = 5 Torr Water pressure = 17 Torr Nitrogen for pressure control = 200 sccm Ar for pressure control = 50 sccm |
| 6 | Flow inert gas for purging | 15 s | Nitrogen = 200 sccm Argon = 50 sccm |
| 7 | Flow $H_2O$ vapor | 1 hour | 300° C., chamber pressure = ~30 Torr |
| 8 | Flow $N_2$ for drying | 30 min | 300 - 500° C., chamber pressure = 5 Torr |
| 9 | Turn on $H_2$ only plasma | 5 min | H2 = 200 sccm; Freq = 13.56 MHz, chamber pressure = 2 Torr; power = 100 W |
| 10 | Remove Si film from the reactor | | |

Steps 3 to 4 were repeated 5 times before moving to step 5, and steps 3 to 6 were repeated multiple times to get desired thickness. Step 8,9, and 10 are optional for comparison.

TABLE 15

Film properties of carbon doped silicon oxide film processed in-situ using 1,1,3,3-tetrachloro-1,3-disilacyclobutane.

| | WER (Å/s) | Density (g/cc) | Si at. % | O at. % | C at. % | N at. % | Cl at. % |
|---|---|---|---|---|---|---|---|
| No additional process | 0.08 | 1.34 | 36.04 | 33.17 | 28.69 | 0.6 | 1.5 |
| $N_2$ dry | <0.02 | 1.44 | 36.19 | 34.37 | 27.33 | 0.3 | 1.8 |
| $N_2$ dry + $H_2$ plasma | <0.02 | 1.58 | 36.39 | 35.43 | 25.68 | 0.54 | 1.9 |

The resulting film has film properties in Table 15. Film etch rates are very low, i.e. 0.12× thermal oxide, for as-deposited film with no anneal. The etch rates dropped to level below our detection limit after additional processing ($N_2$ dry or $N_2$ dry and plasma).

Film density for as-deposited film is 1.34 g/cc with slight densification with additional N2 dry or $N_2$ dry and $H_2$ plasma treatment. In all cases, the film has high carbon content 25-29% and low Cl content (<2%).

Example 11. Low Dielectric Constant Carbon Doped Silicon Oxide Film Deposited From 1,1,3,3-Tetrachloro-1,3-Disilacyclobutane and Water/Pyridine 1,1,3,3-tetrachloro-1,3-disilacyclobutane and $H_2O$ were used for film deposition. Pyridine was used as a reaction catalyst. The chemical (canister temp=70° C.) was delivered with Ar sweeping through the precursor canister. Water temperature was 17° C. (vapor pressure=15 torr) and water vapor was delivered with vapor draw, and pyridine temp was 25~35° C. (vapor pressure=15~25 torr) and pyridine vapor was delivered with vapor draw. Main $N_2$ flow rate was 200 sccm, and Ar flow rate was 50 sccm.

The deposition process comprised of the steps described in Table 16.

TABLE 16

Deposition steps used in depositing Si-containing film from 1,1,3,3-tetrachloro-1,3-disilacyclobutane and water/pyridine.

| Steps | Descriptions | Time | Notes |
|---|---|---|---|
| 1 | Insert Si substrates into a reactor | | |
| 2 | Heat substrates to desired temperature | 5 minutes | T = 40° C. |
| 3 | Flow 1,1,3,3-tetrachloro-1,3-disilacyclobutane and pyridine, co-injection | 0.5 second | Chamber pressure = 5 Torr Precursor temperature = 70° C., Ar carrier gas = 25 sccm Nitrogen for pressure control = 200 sccm Ar for pressure control = 50 sccm |
| 4 | Flow inert gas to purge unreacted precursors | 15 s | Nitrogen = 200 sccm Ar = 50 sccm |
| 5 | Flow $H_2O$ and pyridine, co-injection | 3 s | Chamber pressure = 5 Torr Water pressure = 17 Torr Nitrogen for pressure control = 200 sccm Ar for pressure control = 50 sccm |
| 6 | Flow inert gas for purging | 15 s | Nitrogen = 200 sccm Argon = 50 sccm |
| 7 | Remove Si substrate from the reactor | | |

Steps 3 to 6 were repeated 500 times to get desired thickness.

The film as-deposited has refractive index of 1.53 and GPC of 0.8 Å/cycle. The film composition, measured by XPS, is: Si=35.3%, O=34.0%, C=28.9%, N=0.6% and Cl=1.3%. Film density is 1.8 g/cc and dilute etch rate is 0.08 Å/s.

The film then subjected to standard ex-situ $H_2$/Ar plasma treatment at 300° C. as described previously. The film dielectric constant was measured before and after plasma treatment is 3.6, which is improved from as-deposited film (k=6.1)

Example 12. High Carbon Content Si Oxide Film From In-Situ Processing

A solution of 20 wt. % of 1,1,3,3-tetrachloro-1,3-disilacyclobutane in octane was used for film deposition. The chemical was delivered using direct liquid injection (canister temperature=60° C., Ar flow through the vaporizer was 100 sccm. Liquid flow rate was ~200 mg/min). Vaporizer temperature was 70° C.

The deposition process comprised of the steps described in Table 17.

TABLE 17

Deposition steps used in depositing silicon containing film using 1,1,3,3-tetrachloro-1,3-disilacyclobutane solution

| Steps | Descriptions | Time | Notes |
|---|---|---|---|
| 1 | Insert Si substrates into a reactor | | |
| 2 | Heat substrates to desired temperature | 5 minutes | T = 300° C. |
| 3 | Flow 1,1,3,3-tetrachloro-1,3-disilacyclobutane 20% in octane | 2 seconds | Ch P = 8 Torr |
| 4 | Soak Si precursor | 5 s | Ar gas and precursor flow were stopped. Throttle valve closed while maintaining chambers pressure. |
| 5 | Flow Ar to purge precursor | 10 s | |
| 6 | Flow $NH_3$ | 15 s | $NH_3$ = 500 sccm, Chamber pressure = 15 Torr |
| 7 | Soak $NH_3$ | 20 s | $NH_3$ flow stopped. Throttle valve closed |
| 8 | Flow Ar to purge $NH_3$ | 10 s | |
| 9 | Flow $H_2O$ vapor to convert to $SiO_2$ | 1 hour | 300° C., chamber pressure = 5 Torr |
| 10 | Remove Si film from the reactor | | |

Steps 3 to 4 were repeated 5 times before moving to step 5, and steps 3 to 8 were repeated multiple times to get desired thickness. The Step 9 is optional for some wafers in order to get comparison between $H_2O$ in-situ anneal and conversion in ambient.

Table 18 shows similar film composition as measured by XPS, for both carbon doped silicon oxide converted in ambient and the one with in-situ $H_2O$ treatment.

TABLE 18

Comparison of Film Composition of Carbon Doped Silicon Oxide

| | Si | O | C | N | Cl |
|---|---|---|---|---|---|
| Ambient conversion | 34.69 | 41.4 | 21.82 | 1.74 | 0.35 |
| In-situ $H_2O$ | 35.2 | 38.22 | 23.49 | 2.82 | 0.27 |

Example 13. High Temperature Annealing of Carbon Doped Silicon Oxide Film

Carbon doped silicon oxide film was deposited using 1,1,3,3-tetrachloro-1,3-disilacyclobutane and ammonia at 300° C. in ALD mode using 300 mm commercial cross flow reactor. The ALD steps, shown in Table 8, are repeated to get desired thickness.

The as-deposited carbon doped silicon oxide film was annealed at 500° C. to 800° C. in inert for 1 hour.

The film dielectric constant shows in Table 19.

TABLE 19

Dielectric constant of Si-containing film, deposited using 1,1,3,3-tetrachloro-1,3-disilacyclobutane and ammonia, after thermal annealing

| Annealing temperature (° C.) | dielectric constant (k) after annealing (before oxygen ash) |
|---|---|
| No anneal (room temperature) | 5.7 |
| 500° C. | 2.6 |
| 600° C. | 2.3 |
| 700° C. | 2.6 |
| 800° C. | 3.9 |

High temperature annealing is effective in reducing film dielectric constant.

Comparative Example 1: Effect of Hydrogen Plasma Treatment and Oxygen Ashing on Carbon Doped Silicon Oxide Film Deposited by Pecvd Using Diethoxymethysilane Carbon doped silicon oxide film was deposited using diethoxymethylsilane (DEMS) using a 200 mm commercial PECVD tool at 300° C. The process parameters are as follow: Power=500 W; Pressure=9 Torr; Si precursor flow=500 sccm; He flow=300 sccm; film thickness=500 Å.

The as-deposited film has composition shown in Table 20

TABLE 20

Film composition of Carbon doped silicon oxide film using DEMS PECVD process, measured by XPS

| Measurement depth (Å) | C % | N | O | Si | Cl |
|---|---|---|---|---|---|
| 0 | 21.8% | ND | 44.8% | 27.0% | ND |
| 100 | 28.3% | ND | 46.4% | 32.7% | ND |

The film density is 1.48 g/cc. WER in dilute HF (1:99 49% HF and DI water) for as-deposited (before $H_2$ plasma) is in Table 21. The film shows very high dilute HF etch resistance, indicating by low etch rate.

TABLE 21

WER in dilute HF (1:99, 0.5 wt. %) for Carbon doped silicon oxide from as-deposited PECVD DEMS (before $H_2$ plasma). The thermal silicon oxide reference etch rate is 0.48 ± 0.02 Å/s

| Etch time (seconds) | Carbon doped silicon oxide film Thickness (Å) | Etch rate (Å/s) |
|---|---|---|
| 0 | 515 | N/A |
| 15 | 513 | 0.16 |
| 195 | 512 | 0.03 |

The film was then treated with $H_2$ plasma for 5 minutes at 300 W and 300° C. After $H_2$ plasma treatment, the sample was exposed to oxygen ashing. Both hydrogen plasma treatment and oxygen ashing processes are the same as described previously.

Table 22 shows dielectric constant measurement of PECVD DEMS samples

TABLE 22

PECVD DEMS dielectric constant after $H_2$ plasma treatment and $H_2$ plasma followed by oxygen ashing

| Dielectric constant (k) | Before $H_2$ plasma | 5 min $H_2$ plasma | After 5 min $H_2$ plasma and oxygen ashing |
|---|---|---|---|
| PECVD DEMS | 3.2 | 3.7 | 5.5 |

The dielectric constant increases after $H_2$ plasma from 3.2 to 3.7 indicating higher damaged thickness. Oxygen ashing further increases film dielectric constant to 5.5. The dilute HF (1:99 49% HF and DI water) characterization after $H_2$ plasma followed by oxygen ashing, tabulated in Table 17.

TABLE 23

WER in dilute HF (1:99) for carbon doped silicon oxide from PECVD DEMS after $H_2$ plasma followed by oxygen ashing ash. The thermal silicon oxide reference etch rate is 0.48 ± 0.02 Å/s

| Etch time (seconds) | Carbon doped silicon oxide film Thickness (Å) | Etch rate (Å/s) |
|---|---|---|
| 0 | 484 | N/A |
| 15 | 435 | 3.29 |
| 195 | 377 | 0.32 |

The Carbon doped silicon oxide film clearly shows damaged layer thickness more than 100 Å. Film etch rate for film after oxygen ash is much higher than (>10×) as deposited film. High film dielectric constant after exposing to oxygen ashing process is consistent with thick damaged layer from oxygen ash.

Comparative Example 2. Silicon Containing Film Control Without Post Deposition Treatment Carbon doped silicon oxide film was deposited using thermal ALD process using 1,1,3,3-tetrachloro-1,3-disilacyclobutane and ammonia at 300° C. as described in Table 3. After deposition the film was then anneal at room temperature in air for 3 hours at 300° C. Standard oxygen ash was performed on the carbon doped silicon oxide film. Dilute HF was used to determine damaged thickness, shown in Table 24.

TABLE 24

Dilute HF etch rate of carbon doped silicon oxide film after exposed to oxygen ash

| Etch time (seconds) | Carbon doped silicon oxide film Thickness (Å) | Etch rate (Å/s) |
|---|---|---|
| 0 | 626 | — |
| 15 | 586 | 2.67 |
| 30 | 533 | 3.56 |
| 60 | 413 | 3.99 |
| 120 | 364 | 0.81 |
| 240 | 350 | 0.12 |
| 480 | 343 | 0.06 |

The etch rate of the first ~260 Å from the surface shows very high etch rate compared to as deposited film (0.01 Å/s) suggest that carbon is removed. Carbon removal is consistent with damaged film from oxygen ash.

Example 10. Formulation of 1,1,3,3-tetrachloro-1,3-disilacyclobutane

TABLE 25 summarizes the solubility of 1,1,3,3-tetrachloro-1,3-disilacyclobutane in various solvents as potential formulation for delivery of vapors via direct liquid injection since 1,1,3,3-tetrachloro-1,3-disilacyclobutane is a solid at room temperature.

| | Solubility | |
|---|---|---|
| Solvent | wt. % | mol % (moles of 280/total moles) |
| OMCTS | 23.0 | 20.6 |
| dodecane | 26.2 | 18.3 |
| HMDSO | 30.5 | 24.0 |
| octane | 47.3 | 31.2 |
| cyclooctane | 51.2 | 34.2 |
| toluene | 57.7 | 35.7 |

While the invention has been described with reference to certain embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for forming a carbon doped silicon oxide film having carbon content ranging from 15 at. % to 30 at. % via a thermal ALD process, the method comprising:
   a) placing one or more substrates comprising a surface feature into a reactor;
   b) heating to reactor to one or more temperatures ranging from ambient temperature to about 550° C. and optionally maintaining the reactor at a pressure of 100 torr or less;
   c) introducing into the reactor at least one silicon precursor having two Si—C—Si linkages selected from the group consisting of 1-chloro-1,3-disilacyclobutane, 1-bromo-1,3-disilacyclobutane, 1,3-dichloro-1,3-1,3-disilacyclobutane, 1,3-dibromo-1,3-disilacyclobutane, 1,1,3-trichloro-1,3-disilacyclobutane, 1,1,3-tribromo-1,3-disilacyclobutane, 1,1,3,3-tetrachloro-1,3-disilacyclobutane, 1,1,3,3-tetrabromo-1,3-disilacyclobutane, 1,3-dichloro-1,3-dimethyl-1,3-disilacyclobutane, 1,3-bromo-1,3-dimethyl-1,3-disilacyclobutane, 1,1,1,3,3,5,5,5-octachloro-1,3,5-trisilapentane, 1,1,3,3,5,5-hexachloro-1,5-dimethyl-1,3,5-trisilapentane, 1,1,1,5,5,5-hexachloro-3,3-dimethyl-1,3,5-trisilapentane, 1,1,3,5,5-pentachloro-1,3,5-trimethyl-1,3,5-trisilapentane, 1,1,1,5,5,5-hexachloro-1,3,5-trisilapentane, 1,1,5,5-tetraachloro-1,3,5-trisilapentane;

d) purging with an inert gas;
e) providing a nitrogen source into the reactor to react with the surface to form a carbon doped silicon nitride film;
f) purging with inert gas to remove reaction by-products;
g) repeating steps c to f to provide a desired thickness of a resulting carbon doped silicon nitride;
h) treating the resulting carbon doped silicon nitride film with an oxygen source at one or more temperatures ranging from about ambient temperature to 1000° C. to convert the carbon doped silicon nitride film into a carbon doped silicon oxide film; and
i) providing post-deposition exposing the carbon doped silicon oxide film to a plasma comprising hydrogen.

2. The method according to claim 1 wherein the step h) of treating the resulting carbon doped silicon nitride film with an oxygen source is performed at one or more temperatures ranging from or from about 100° C. to 400° C.

\* \* \* \* \*